(12) United States Patent
Chao et al.

(10) Patent No.: US 7,482,698 B2
(45) Date of Patent: Jan. 27, 2009

(54) SEMICONDUCTING DEVICE WITH FOLDED INTERPOSER

(75) Inventors: Iwen Chao, Sacramento, CA (US); Steve R. Eskildsen, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 11/534,266

(22) Filed: Sep. 22, 2006

(65) Prior Publication Data

US 2007/0023905 A1 Feb. 1, 2007

Related U.S. Application Data

(63) Continuation of application No. 10/812,277, filed on Mar. 29, 2004, now Pat. No. 7,145,249.

(51) Int. Cl.
*H01L 23/48* (2006.01)
*H01L 23/52* (2006.01)
*H01L 29/40* (2006.01)

(52) U.S. Cl. .................. 257/778; 257/738; 257/779; 257/780; 257/E23.065

(58) Field of Classification Search .................. 257/734, 257/737, 738, 777–781, E23.065
See application file for complete search history.

(56) References Cited

U.S. PATENT DOCUMENTS

| | | | |
|---|---|---|---|
| 5,430,614 A * | 7/1995 | Difrancesco | ................ 361/785 |
| 5,506,753 A | 4/1996 | Bertin et al. | |
| 5,909,058 A | 6/1999 | Yano et al. | |
| 5,956,234 A * | 9/1999 | Mueller | ...................... 361/767 |
| 6,002,165 A | 12/1999 | Kinsman | |
| 6,060,774 A | 5/2000 | Terui | |
| 6,184,064 B1 | 2/2001 | Jiang et al. | |
| 6,208,521 B1 | 3/2001 | Nakatsuka | |
| 6,225,695 B1 | 5/2001 | Chia et al. | |
| 6,297,548 B1 | 10/2001 | Moden et al. | |
| 6,366,467 B1 * | 4/2002 | Patel et al. | ................... 361/760 |
| 6,433,418 B1 | 8/2002 | Fujisawa et al. | |

(Continued)

FOREIGN PATENT DOCUMENTS

JP 63-287026 11/1988

(Continued)

OTHER PUBLICATIONS

"U.S. Appl. No. 10/812,277 Advisory Action mailed Apr. 20, 2006", 3 pgs.

(Continued)

*Primary Examiner*—Monica Lewis
(74) *Attorney, Agent, or Firm*—Schwegman, Lundberg & Woessner, P.A.

(57) ABSTRACT

Some embodiments of the present invention relate to a semiconducting device that includes an interposer having a fold which divides the interposer into a first section and a second section. A first die is attached to a first surface of the interposer at the first and second sections of the interposer. The semiconducting device further includes a contact that is attached to the first surface of the interposer at the first section and the second section. A second die is attached to a second surface of the interposer such that the second die is stacked onto the first die and is electrically coupled to the first die by the contact and conductive paths that are part of the interposer.

15 Claims, 7 Drawing Sheets

U.S. PATENT DOCUMENTS

| | | | |
|---|---|---|---|
| 6,884,653 | B2 | 4/2005 | Larson |
| 7,145,249 | B2 * | 12/2006 | Chao et al. .................. 257/778 |
| 2003/0062614 | A1 | 4/2003 | Larson |
| 2003/0148597 | A1 | 8/2003 | Tan et al. |
| 2004/0021211 | A1 | 2/2004 | Damberg |
| 2005/0212112 | A1 | 9/2005 | Chao et al. |
| 2006/0284312 | A1 | 12/2006 | Lee |
| 2007/0026569 | A1 | 2/2007 | Chao |

OTHER PUBLICATIONS

"U.S. Appl. No. 10/812,277 Final Office Action mailed Feb. 28, 2006", 6 pgs.

"U.S. Appl. No. 10/812,277 Non Final Office Action mailed Sep. 20, 2005", 7 pgs.

"U.S. Appl. No. 10/812,277 Notice of Allowance mailed Jul. 26, 2006", 4 pgs.

"U.S. Appl. No. 10/812,277 Response filed Mar. 21, 2006 to Final Office Action mailed Feb. 28, 2006", 11 pgs.

"U.S. Appl. No. 10/812,277 Response filed May 30, 2006 to Advisory Action mailed Apr. 20, 2006", 9 pgs.

"U.S. Appl. No. 10/812,277 Response filed Nov. 29, 2005 to Non Final Office Action mailed Sep. 20, 2005", 10 pgs.

"U.S. Appl. No. 11/534,274 Non-Final Office Action mailed Apr. 15, 2008", 7 Pgs.

* cited by examiner

SEMICONDUCTING DEVICE WITH FOLDED INTERPOSER

This application is a continuation of U.S. patent application Ser. No. 10/812,277, filed on Mar. 29, 2004, now issued as U.S. Pat. No. 7,145,249, which is incorporated herein by reference.

TECHNICAL FIELD

Some embodiments of the present invention relate to a semiconducting device, and in particular, to a semiconducting device that includes multiple dice attached to a folded interposer, and to manufacturing methods related thereto.

BACKGROUND

High performance semiconducting devices are continually being redesigned in order to increase processing speed and/or power. Each increase in processing speed and power generally carries a cost of increased size such that additional innovations must be made in order to minimize the size of the semiconducting devices. Manufacturers of semiconducting devices constantly try to improve product performance and reduce product size while minimizing production costs. A typical semiconducting device includes a die that is mounted on a substrate which functionally connects the die through a hierarchy of electrically conductive paths to the other elements that make up an electronic system.

Several methods have been employed to minimize the size of semiconducting devices. One method includes placing one or more dice onto an interposer and then folding the interposer to place one die on top of another.

One drawback of a semiconducting device that includes a folded interposer is that it is difficult to deliver power and/or signals to each of the dice because all of the conductive paths must be crowded through the fold in the interposer. Therefore, as the size of a semiconducting device decreases, it becomes more difficult to deliver signals and power to the dice through the fold in the interposer.

One way to address crowding within the fold in the interposer is to make the conductive paths smaller and place them closer together. However, when the conductive paths are small and crowded together, there is increased resistance, inductance and crosstalk within the conductive paths. This increased resistance, inductance and crosstalk causes unwanted signal degradation and power loss that inhibit the performance of the semiconducting device.

DETAILED DESCRIPTION

Figure 1:
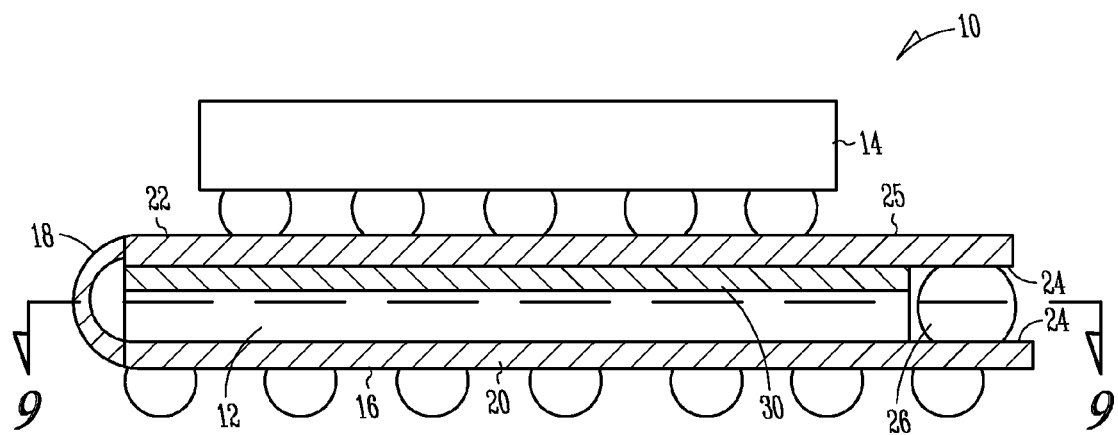
FIG. 1 is a schematic section view of a semiconducting device that includes multiple dice on a folded interposer.

In the following detailed description, reference is made to the accompanying drawings. In the drawings, like numerals describe substantially similar components throughout the several views. Other embodiments may be utilized, and structural, logical, and electrical changes may be made.

Figure 2:
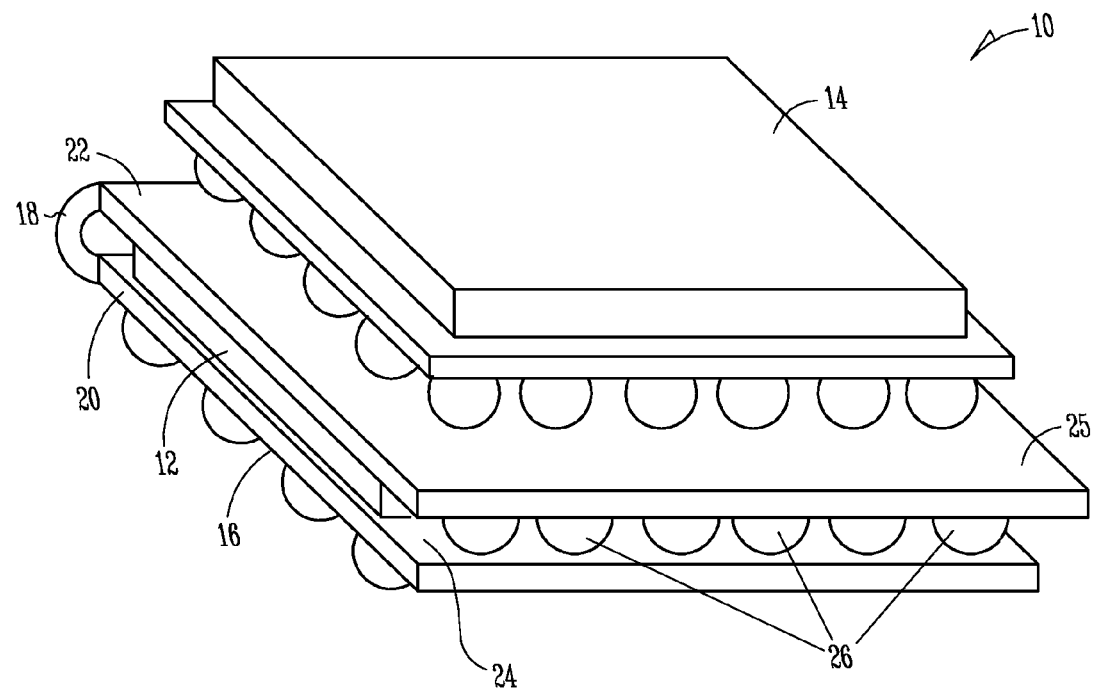
FIG. 2 is a perspective view illustrating the semiconducting device of FIG. 1.

FIGS. 1 and 2 illustrate a semiconducting device 10 that includes a first die 12 and a second die 14. The semiconducting device 10 further includes an interposer 16 that has a fold 18 which divides the interposer 16 into a first section 20 and a second section 22. First die 12 is attached to a first surface 24 of interposer 16 at first section 20 and second section 22. Second die 14 is attached to a second surface 25 of interposer 16. Second die 14 is stacked onto first die 12 and is electrically coupled to first die 12 by at least one contact 26 and conductive paths (not shown) that are part of interposer 16. Contacts 26 are attached to the first surface 24 of interposer 16 at first section 20 and second section 22.

It should be noted that the arrangement of the first and second dice 12, 14 relative to one another will depend on a variety of circuit design factors. The first and second dice 12, 14 may be encapsulated by any known procedure, such as molding and sealing. The thickness of first and second dice 12, 14 may be about 0.2 millimeter (mm) and the thickness of interposer 16 may be about 0.1 mm.

Other fabrication processes such as wire bonding, lead bonding and bump bonding to conductors (not shown) in the interposer 16 may be done to first and second dice 12, 14 prior to encapsulation. In addition, first and second dice 12, 14 may be subjected to additional processes such as ball attaching and/or marking after encapsulation. It should be noted that semiconducting device 10 may include additional dice (not shown) formed on first and second surfaces 24, 25 of interposer 16.

The first and second dice 12, 14 may be secured to the first and second surfaces 24, 25 of interposer 16 using an adhesive, a conductive epoxy or some form of solder attachment (among other methods). FIG. 1 illustrates that first die 12 is secured to first surface 24 of interposer 16 at first section 20 and second section 22.

Figure 3:
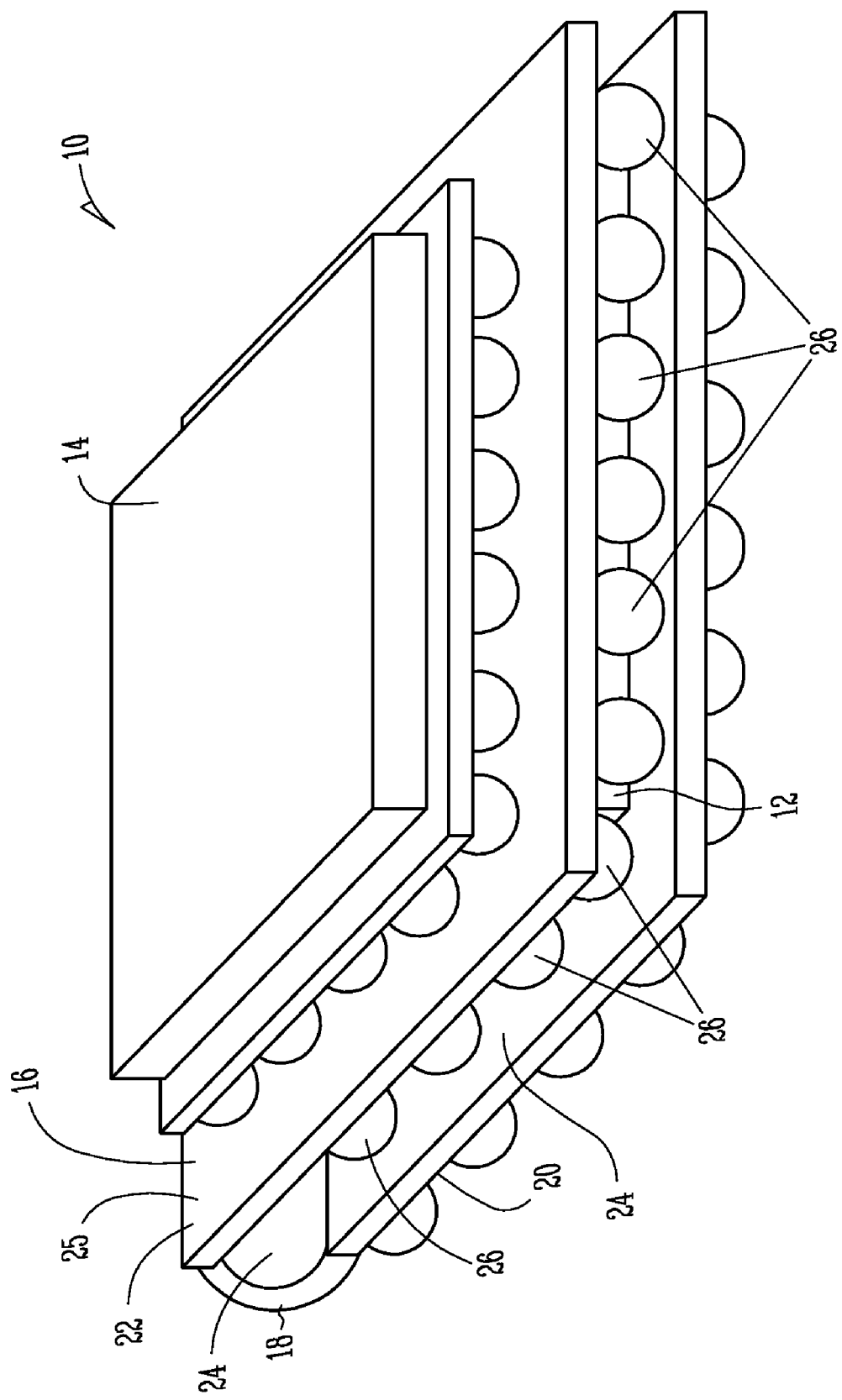
FIG. 3 is a perspective view illustrating another semiconducting device that includes multiple dice on a folded interposer.
Figure 4:
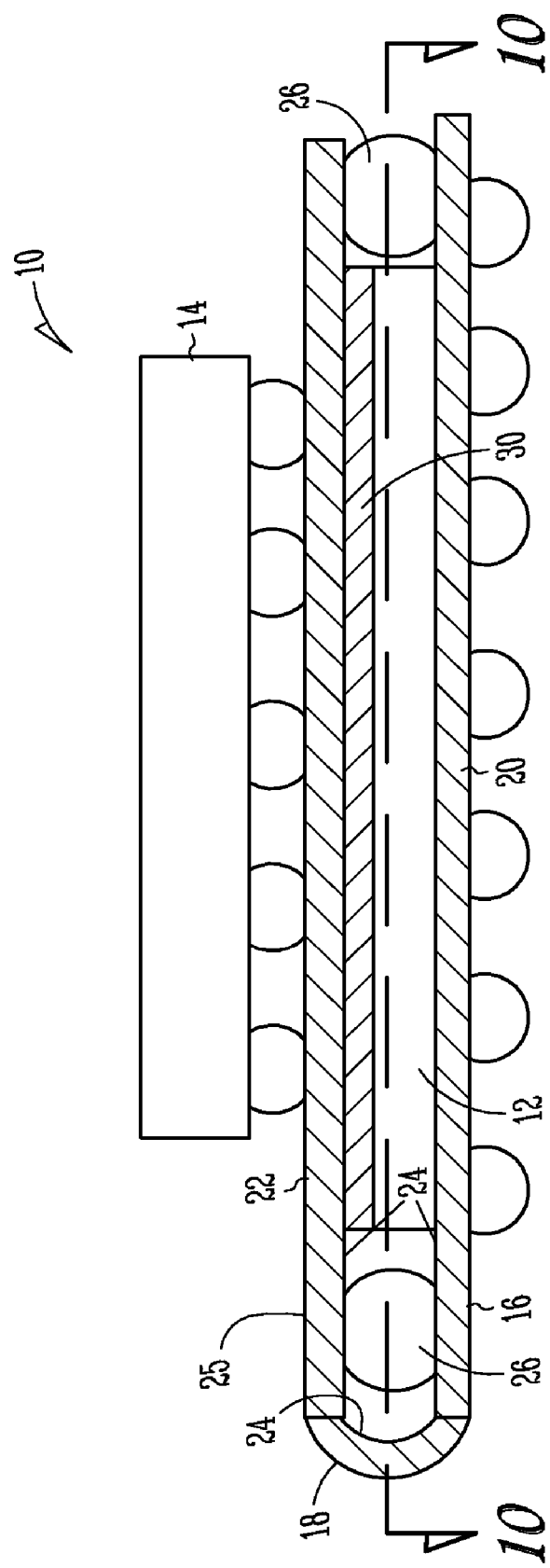
FIG. 4 is a schematic section view of another semiconducting device that includes multiple dice on a folded interposer.
Figure 9:
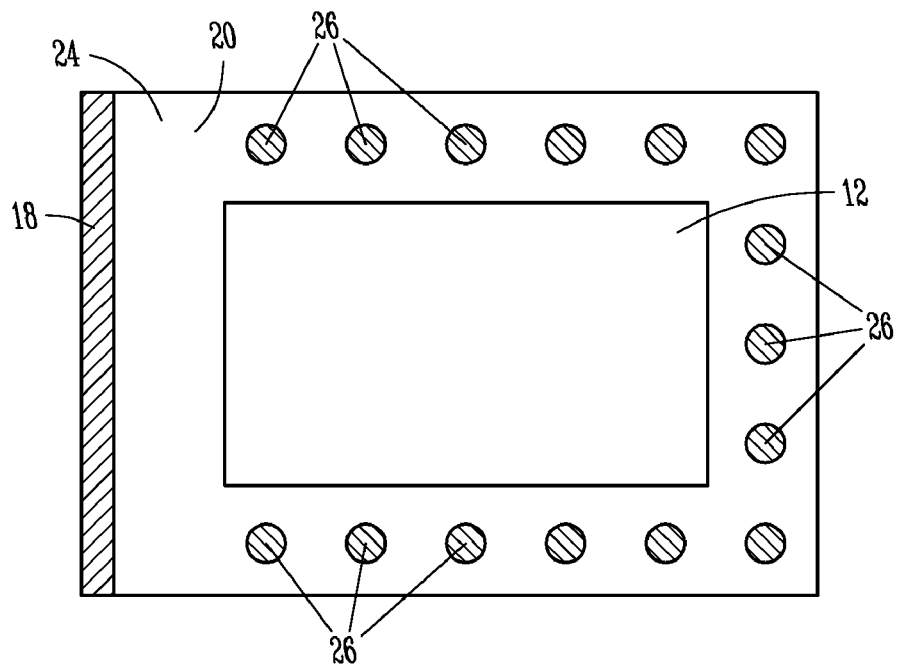
FIG. 9 is a section view of the example semiconducting device shown in FIG. 1 taken along line 9-9.
Figure 10:
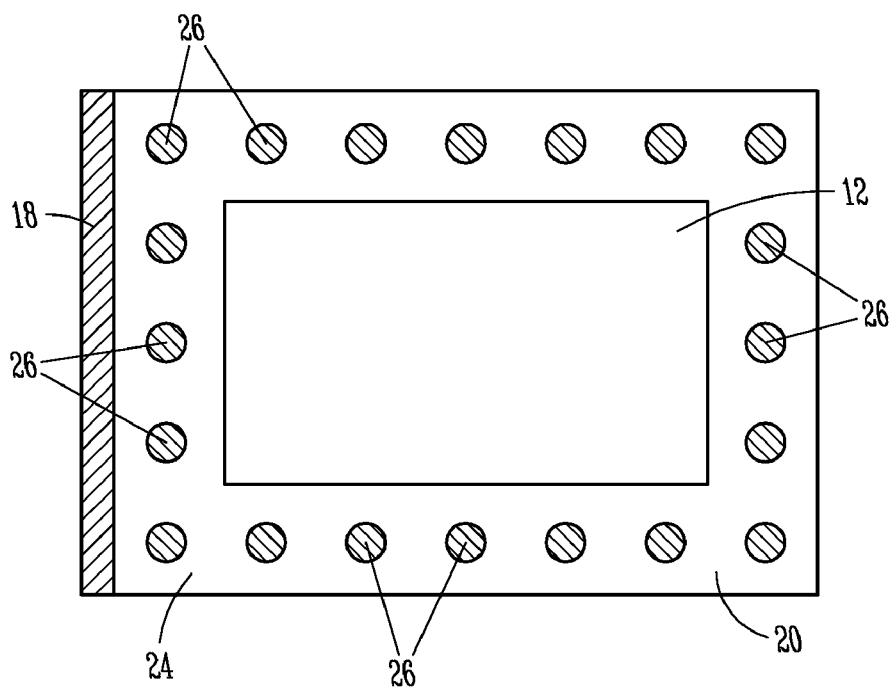
FIG. 10 is a section view of the example semiconducting device shown in FIG. 4 taken along line 10-10.

As shown in FIGS. 2-4, semiconducting device 10 may include a plurality of contacts 26 that are each attached to the first surface 24 of interposer 16 at first section 20 and second section 22. In some embodiments, fold 18 is on one side of first die 12 and at least one of the contacts 26 is on an opposing side of first die 12 (FIGS. 1 and 2). In other embodiments, at least one of the contacts 26 is on some, or all, sides of first die 12. FIG. 9 shows an example semiconducting device 10 where at least one of the contacts 26 is on three sides of the first die 12 while FIG. 10 shows an example semiconducting device 10 where at least one of the contacts 26 is on each side of the first die 12. In FIGS. 3 and 4, contacts 26 are visible on only two sides of first die 12 because of the orientation of the FIGS.

The plurality of contacts 26 provides additional conductive paths for delivering signals and power between and/or to first and second dice 12, 14. The plurality of contacts 26 may also decrease the overall distance of many of the conductive paths within semiconducting device 10 depending on the design of the semiconducting device 10.

In the example embodiments illustrated in the FIGS. 1-4, each of the contacts 26 is a solder column. It should be noted that any type of contact 26 may be used as long as contact 26 extends from first surface 24 of interposer 16 between first section 20 and second section 22. A number of materials may be used for interposer 16 and contacts 26. The choice of materials will depend on the relevant circuit design considerations and the costs that are associated with fabricating semiconducting device 10 (among other factors).

Figure 5:
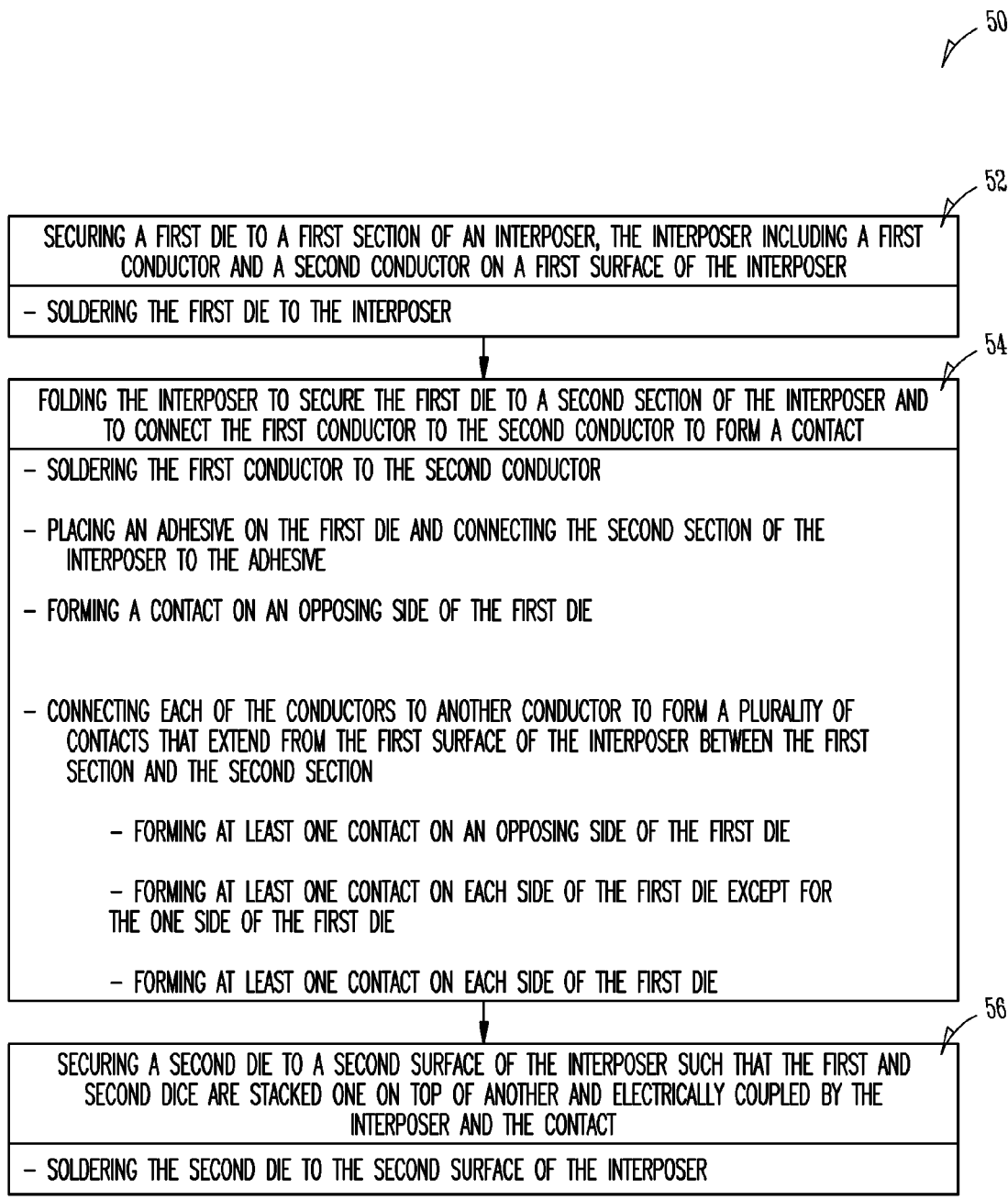
FIG. 5 illustrates a method of fabricating a semiconducting device that includes multiple dice on a folded interposer.
Figure 6:
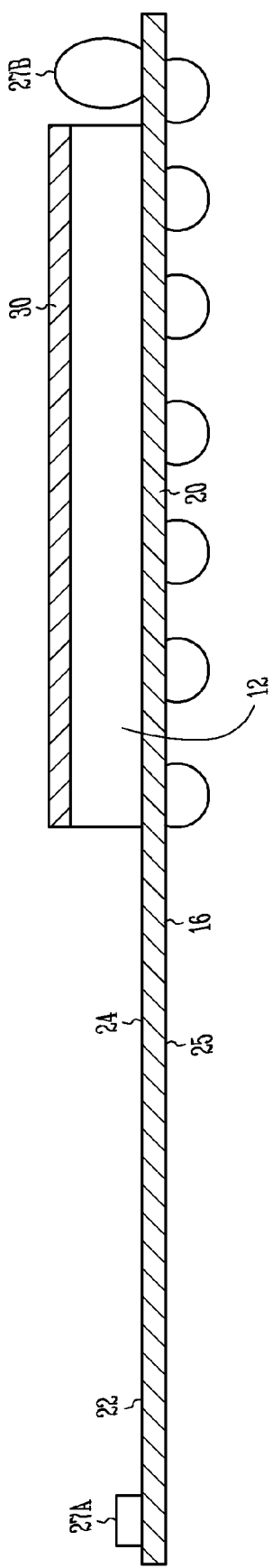
FIG. 6 is a schematic section view illustrating portions of the semiconducting device shown in FIG. 1 prior to folding.

Referring now also to FIG. 5, a flow diagram 50 illustrates an example method of the present invention. The method includes securing a first die 12 to a first section 20 of an interposer 16 that has a first conductor 27A and a second conductor 27B on a first surface 24 of interposer 16 (represented by box 52 in FIG. 5 and shown in FIG. 6). The first die 12 may be secured to the first surface 24 of interposer 16 using solder or adhesives (among other methods).

Figure 7:
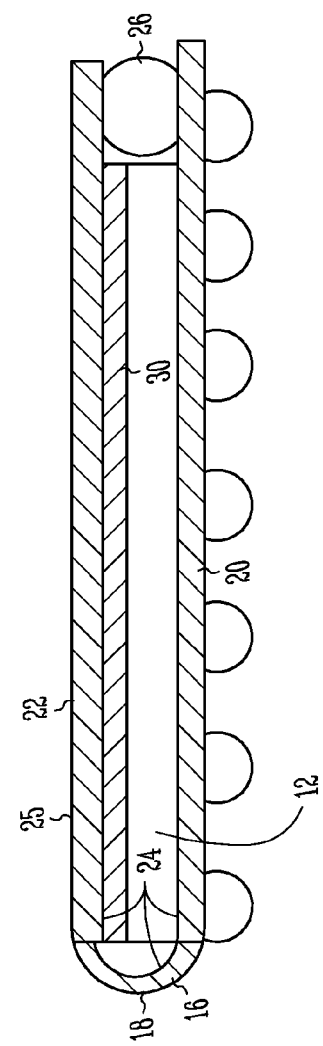
FIG. 7 is a schematic section view illustrating the portions of the semiconducting device shown in FIG. 6 after folding.

The method 50 further includes folding interposer 16 to secure first die 12 to a second section 22 of interposer 16 and to connect the first conductor 27A to the second conductor 27B to form a contact 26 (represented by box 54 in FIG. 5 and shown in FIG. 7). The method further includes securing a second die 14 to a second surface 25 of interposer 16 (e.g., by soldering) such that first and second dice 12, 14 are stacked one on top of another and electrically coupled together by interposer 16 and contact 26 (represented by box 56 in FIG. 5 and shown in FIG. 1).

As shown in FIGS. 1, 4, 6 and 7, folding interposer 16 to secure first die 12 to a second section 22 of interposer 16 may include placing an adhesive 30 on first die 12 and connecting the first surface 24 of interposer 16 to adhesive 30. Fold 18 may be on one side of first die 12 with first conductor 27A and second conductor 27B joined together to form contact 26 on an opposing side of first die 12 (see, e.g., FIGS. 1, 2 and 6).

In some example embodiments of the method, interposer 16 may include a plurality of conductors on the first surface 24 of interposer 16 such that folding interposer 16 includes connecting each of the plurality of conductors on a first section 20 of interposer 16 to conductors on a second section 22 of interposer 16 to form a plurality of contacts 26. Each of the contacts 26 extends from the first surface 24 of interposer 16 between first and second sections 20, 22 of interposer 16 (see, e.g., FIGS. 2-4).

Fold 18 may be on one side of first die 12 such that forming a plurality of contacts 26 includes (i) forming at least one contact 26 on an opposing side of first die 12 (FIG. 2); (ii) forming at least one contact 26 on each side of the first die 12 except for the side of first die 12 that is adjacent to the fold 18 (two sides visible in FIG. 3); and/or (iii) forming at least one contact 26 on each side of first die 12 (two sides visible in FIG. 4).

Forming a plurality of contacts 26 that extend from the first surface 24 of interposer 16 between the first and second sections 20, 22 of interposer 16 increases the number of possible connections between first and second dice 12, 14 as compared to just interposer 16 alone. The method may also reduce the length of the conductive paths between first and second dice 12, 14 since contacts 26 can be positioned on all sides of first die 12 instead of just through the fold 18 in interposer 16. Increasing the number of available connections, and reducing the length of the connections, may reduce resistance, inductance and crosstalk to improve signal integrity relative to first and second dice 12, 14 and power delivery to second die 14 within semiconducting device 10.

Figure 8:
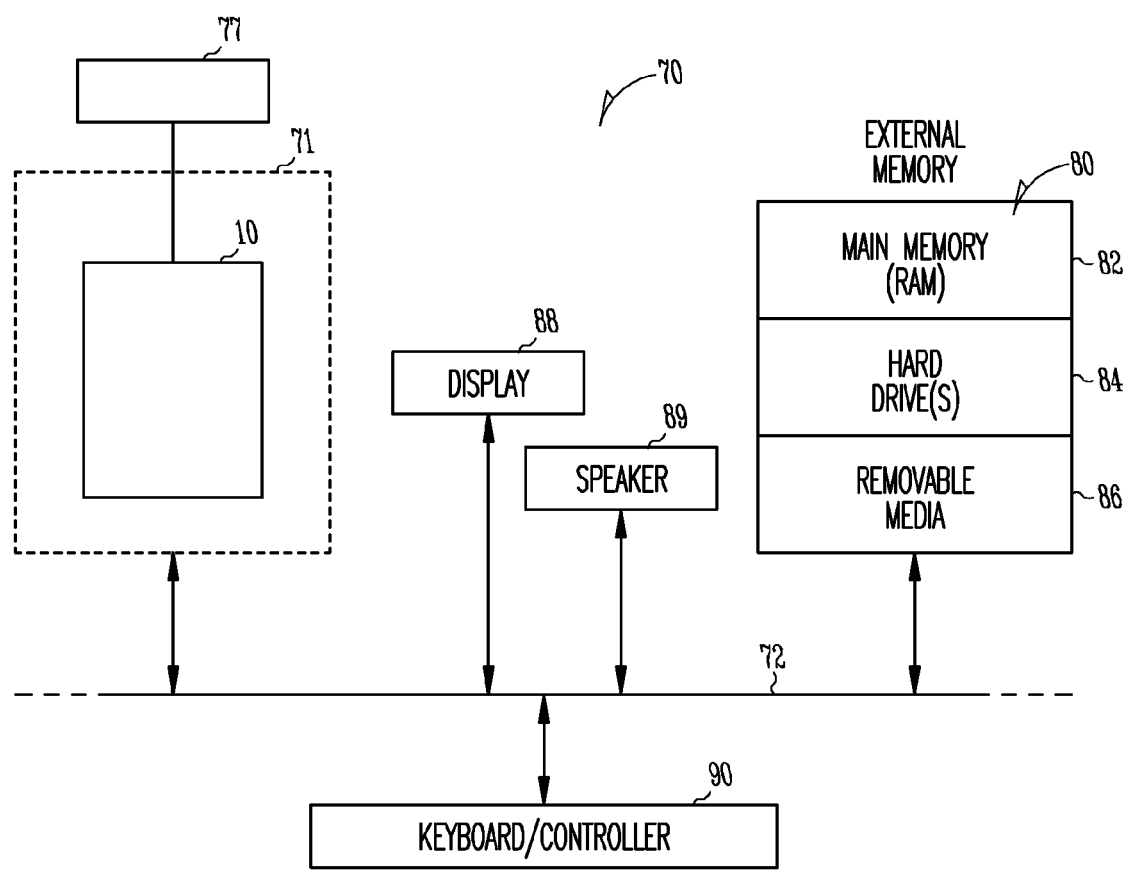
FIG. 8 is a block diagram of an electronic system that incorporates at least one semiconducting device of the type shown in FIGS. 1-7.

FIG. 8 is a block diagram of an electronic system 70, such as a computer system, that includes a motherboard 71 which is electrically coupled to various components in electronic system 70 via a system bus 72. System bus 72 may be a single bus or any combination of busses.

Any of the semiconducting devices 10 described herein may be mounted onto motherboard 71. Semiconducting device 10 may include a microprocessor, a microcontroller, memory, a graphics processor or a digital signal processor, and/or a custom circuit or an application-specific integrated circuit, such as a communications circuit for use in wireless devices such as cellular telephones, pagers, portable computers, two-way radios, and similar electronic systems.

The electronic system 70 may also include an external memory 80 that in turn includes one or more memory elements suitable to the particular application, such as a main memory 82 in the form of random access memory (RAM), one or more hard drives 84, and/or one or more drives that handle removable media 86, such as floppy diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 70.

In some embodiments, electronic system 70 may further include a voltage source 77 that is electrically coupled to semiconducting device 10. Voltage source 77 may be used to supply power to a die (e.g., a processor) that is within semiconducting device 10.

Semiconducting device 10 can be implemented in a number of different embodiments, including an electronic system and a computer system. The elements, materials, geometries, dimensions, and sequence of operations can all be varied to suit particular packaging requirements. Parts of some embodiments may be included in, or substituted for, those of other embodiments.

FIGS. 1-8 are merely representational and are not drawn to scale. Certain proportions thereof may be exaggerated while others may be minimized. Many other embodiments will be apparent to those of skill in the art.

The semiconducting device and method described above provide a solution for stacking dice in semiconducting packages. The semiconducting device also provides circuit designers with the availability to connect stacked dice on a folded interposer through conductive paths other than those within the interposer.

What is claimed is:

1. A semiconducting device comprising:
    an interposer that includes a fold which divides the interposer into a first section and a second section;
    a first die attached to a first surface of the interposer at the first section and the second section;
    an electrical contact attached to the first surface of the interposer at the first section and the second section;
    a second die attached to a second surface of the interposer, the second die being stacked onto the first die and electrically coupled to the first die by the electrical contact and conductive paths that are part of the interposer, wherein the electrical contact does not engage the fold.

2. The semiconducting device of claim 1, wherein the electrical contact is a solder column.

3. The semiconducting device of claim 1, further comprising a plurality of electrical contacts that are each attached to the first surface of the interposer at the first section and the second section.

4. The semiconducting device of claim 3, wherein the fold is on one side of the first die and at least one of the electrical contacts is on an opposite side of the first die.

5. The semiconducting device of claim 3, wherein at least one of the electrical contacts is on each side of the first die.

6. The semiconducting device of claim 3, wherein at least one of the electrical contacts is on one side of the first die and at least one other of the electrical contacts is on an opposing side of the first die.

7. The semiconducting device of claim 3, wherein the plurality of electrical contacts are attached to the first surface of the interposer at the first section and the second section such that there is at least one electrical contact on three sides of the first die.

8. An electronic system comprising:
 a bus;
 a memory coupled to the bus;
 a semiconducting device that is electrically connected to the bus, the semiconducting device having an interposer that includes a fold which divides the interposer into a first section and a second section, the semiconducting device further including a first die and a electrical contact that are each attached to the first surface of the interposer at the first section and the second section, the semiconducting device further including a second die that is attached to a second surface of the interposer, the second die being stacked onto the first die and electrically coupled to the first die by the electrical contact and the interposer, wherein the electrical contact does not engage the fold.

9. The electronic system of claim 8, wherein the electrical contact is a solder colunm.

10. The electronic system of claim 8, further comprising a plurality of electrical contacts that are each attached to the first surface of the interposer at the first section and the second section.

11. The electronic system of claim 10, wherein the fold is on one side of the first die and at least one of the electrical contacts is on an opposite side of the first die.

12. The electronic system of claim 10, wherein at least one of the electrical contacts is on each side of the first die.

13. The electronic system of claim 10, wherein at least one of the electrical contacts is on one side of the first die and at least one other of the electrical contacts is on an opposing side of the first die.

14. The electronic system of claim 10, wherein the plurality of electrical contacts are attached to the first surface of the interposer at the first section and the second section such that there is at least one electrical contact on three sides of the first die.

15. The electronic system of claim 8, further comprising a voltage source that is electrically coupled to the semiconducting device.

* * * * *

UNITED STATES PATENT AND TRADEMARK OFFICE
CERTIFICATE OF CORRECTION

PATENT NO.       : 7,482,698 B2
APPLICATION NO.  : 11/534266
DATED            : January 27, 2009
INVENTOR(S)      : Chao et al.

It is certified that error appears in the above-identified patent and that said Letters Patent is hereby corrected as shown below:

In column 6, line 5, in Claim 9, delete "colunm" and insert -- column --, therefor.

Signed and Sealed this

Seventh Day of April, 2009

JOHN DOLL
*Acting Director of the United States Patent and Trademark Office*